(12) United States Patent
Hong

(10) Patent No.: US 7,798,820 B2
(45) Date of Patent: Sep. 21, 2010

(54) COMMUNICATIONS MODULE EDGE CONNECTOR HAVING MULTIPLE COMMUNICATION INTERFACE PADS

(75) Inventor: Liu Hong, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 46 days.

(21) Appl. No.: 11/696,559

(22) Filed: Apr. 4, 2007

(65) Prior Publication Data

US 2007/0232091 A1    Oct. 4, 2007

Related U.S. Application Data

(60) Provisional application No. 60/789,226, filed on Apr. 4, 2006.

(51) Int. Cl.
*H01R 12/00* (2006.01)

(52) U.S. Cl. .................... 439/76.1; 385/92

(58) Field of Classification Search ............. 439/60, 439/76.1, 924.1; 385/88, 89, 92
See application file for complete search history.

(56) References Cited

U.S. PATENT DOCUMENTS

| | | | | |
|---|---|---|---|---|
| 6,368,129 B1 * | 4/2002 | Wang et al. | ............. | 439/260 |
| 6,969,268 B2 * | 11/2005 | Brunker et al. | ............. | 439/108 |
| 6,994,480 B2 * | 2/2006 | Inujima et al. | ............. | 385/92 |
| 7,090,509 B1 * | 8/2006 | Gilliland et al. | ............. | 439/76.1 |
| 7,114,857 B1 * | 10/2006 | Kayner et al. | ............. | 385/88 |
| 7,125,261 B2 * | 10/2006 | Yoshikawa et al. | ............. | 439/76.1 |
| 7,142,802 B2 * | 11/2006 | Lee et al. | ............. | 399/322 |
| 7,416,353 B2 * | 8/2008 | Yoshikawa et al. | ............. | 385/92 |
| 7,453,338 B2 * | 11/2008 | Aronson | ............. | 333/260 |

* cited by examiner

*Primary Examiner*—Thanh-Tam T Le
(74) *Attorney, Agent, or Firm*—Workman Nydegger

(57) ABSTRACT

An edge connector design for use with a printed circuit board included in a communications module is disclosed. In one embodiment, the edge connector comprises a planar surface defining a terminal end of the printed circuit board, and a plurality of conductive contact pads arranged on the planar surface. The contact pads include first and second ground contact pads disposed adjacent opposite side portions of the planar surface and first and second power contact pads disposed proximate a central portion of the planar surface. First and second pairs of differential transmit data signal contact pads, as well as first and second pairs of differential receive data signal contact pads are also included, the pairs being disposed between one of the ground contact pads and one of the power contact pads. The edge connector is received by a female connector of a host device to connect the module to the host.

16 Claims, 6 Drawing Sheets

COMMUNICATIONS MODULE EDGE CONNECTOR HAVING MULTIPLE COMMUNICATION INTERFACE PADS

CROSS-REFERENCE TO RELATED APPLICATIONS

This application claims the benefit of U.S. Provisional Patent Application No. 60/789,226, filed Apr. 4, 2006, and entitled "COMMUNICATIONS MODULE HAVING MULTIPLE COMMUNICATION INTERFACE PINS," which is incorporated herein by reference in its entirety.

BACKGROUND

1. Technology Field

The present invention generally relates to communication modules. In particular, the present invention relates to an electrical connector configuration for use with a communication module that increases the number of transmitting and/or receiving signal paths, thereby increasing per module signal path density.

2. The Related Technology

Specified Multi-Source Agreements ("MSAs") govern various aspects of data-containing optical signals that are both transmitted and received by communication modules, such as optical transceiver modules ("transceivers"), which are typically employed in high-speed communications networks. One aspect related to certain MSAs is the differential nature of electrical data signals that contain data for transmission or reception by components of the transceiver.

In general, data carried to, from, or within a transceiver are often transmitted via dual data paths. The dual data paths operate as differential data paths, wherein one data path operates as the inverse of the other. For example, a logical "1" to be carried will be represented on a first of the dual data paths as a relatively high value, while on the second data path it is represented as a relatively low value. Correspondingly, a logical "0" would be inversely represented as a relatively low value on the first data path and a relatively high value on the second data path. This enables digital interpretation of a logical "1" or "0" in the context of differential data paths by defining a particular relationship between the two data paths as signifying either a "1" or a "0" and then interpreting the received signal accordingly.

Typical transceiver designs include a single differential transmit data path including dual transmit data paths, and a single differential receive data path including dual receive data paths. The differential transmit and receive data paths respectively extend from a transmitter optical subassembly ("TOSA") and a receiver optical subassembly ("ROSA") included in the transceiver and terminate at dual transmit and receive data contact pads located, together with various other contact pads, on an edge connector portion of the transceiver. The edge connector is configured to mate with a corresponding connector included in a slot of a host device so as to operably interconnect the contact pads of the edge connector with corresponding conductive features included in the slot, thereby operably connecting the transceiver to the host device.

In greater detail, the contact pad arrangement of a typical transceiver edge connector includes one or more ground signal pads, power pads "Vcc" for supplying a power supply to the transceiver, a single pair of transmit data contact pads "Tx+" and "Tx−," and a single pair of receive data contact pads "Rx+" and "Rx−." As mentioned, when the transceiver is received into the slot of the host device, the differential transmit and receive data contact pads of the edge connector operably connect with corresponding conductive features of the host so as to enable the transmission and reception of the data signals carried by the differential transmit and receive data paths to flow between the transceiver and the host.

As data transfer demands increase within communication networks, solutions are constantly being sought to increase the density of transmit and receive data paths between a host and one or more transceivers operably connected thereto. In particular, a need has recently arisen for a transceiver to handle more than one pair of transmit and receive data so as to increase transceiver data throughput. A related need has also arisen for minimizing the size of the edge connector while maintaining the number data paths constant. Correspondingly, a need has developed in the art for connector structures that can increase signal density to accommodate the addition of multiple transmit and receive data pathways or reduce edge connector size so as to allow for the desired volume of data that can be transferred to and from a host device in a communications network.

BRIEF SUMMARY

The present invention has been developed in response to the above and other needs in the art. Briefly summarized, embodiments of the present invention are directed to an edge connector design for use with a printed circuit board included in a communications module, such as an optical transceiver module, for instance. Such an edge connector design enables the optical transceiver module to include multiple transmit and/or receive data paths so as to expand the relative data transfer capability of the transceiver without increasing the space needed for such expansion.

In one embodiment, the edge connector comprises a planar surface defining a terminal end of a printed circuit board, and a plurality of conductive contact pads arranged on the planar surface. The contact pads include first and second ground contact pads disposed adjacent opposite side portions of the planar surface and first and second power contact pads disposed proximate a central portion of the planar surface. First and second pairs of differential transmit data signal contact pads, as well as first and second pairs of differential receive data signal contact pads are also included, the pairs being disposed between one of the ground contact pads and one of the power contact pads.

The edge connector is received by a female connector of a host device to connect the module to the host. The female connector includes corresponding conductive features, such as spring fingers, that electrically couple with the various contact pads of the edge connector.

In other embodiments, the contact pads are arranged in various spatial configurations. In yet other embodiments, a third pair of differential transmit and receive contact pads are also included on the edge connector to further increase data signal density in the transceiver. In addition, it is also possible to reduce the size of the edge connector while maintaining constant the number of data signal contact pads present on the edge connector surface.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-9 depict various features of embodiments of the present invention, which are generally directed to a system and assembly for increasing the number of data signal paths available via a communications module, such as an optical transceiver module. As a result, data signal path density between the host and communications network is increased without correspondingly increasingly the number of optical transceiver modules that are operably attached to the transceiver module. As will be seen the present system and assembly can be applied to communication modules of various designs, including hot pluggable optical transceiver modules.

1. Exemplary Operating Environment

Figure 1:
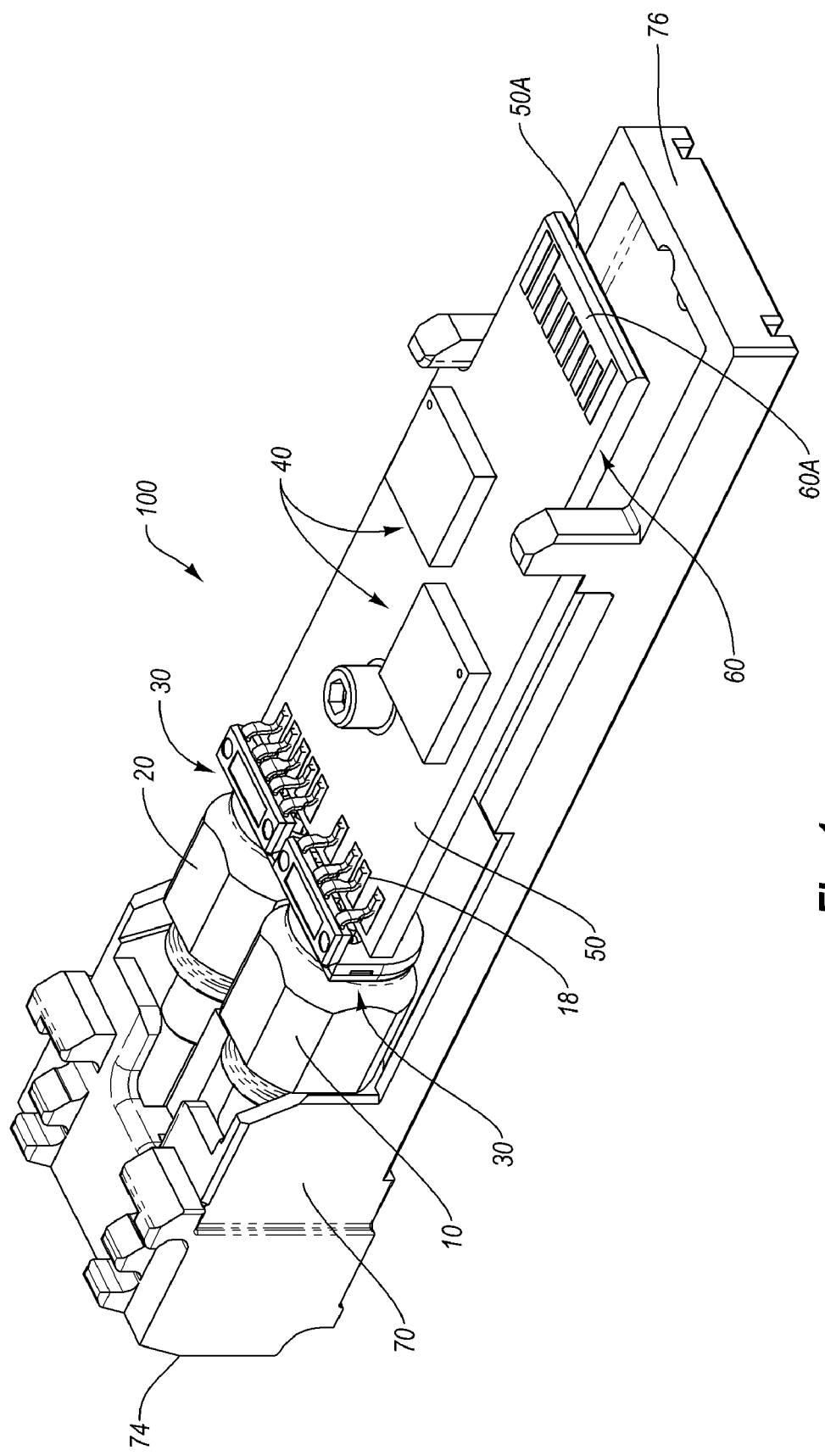
FIG. 1 is a perspective view of an optical transceiver module that is configured in accordance with embodiments of the present invention.

Reference is first made to FIG. 1, which depicts a perspective view of an optical transceiver module ("transceiver"), generally designated at 100, for use in transmitting and receiving optical signals in connection with an external host (not shown here) that is ioperatively connected in one embodiment to a communications network. As shown, the transceiver of FIG. 1 includes various components, including a receiver optical subassembly ("ROSA") 10, a transmitter optical subassembly ("TOSA") 20, electrical interfaces 30, various electronic components 40, and a printed circuit board 50. In detail, two electrical interfaces 30 are included in the transceiver 100, one each used to electrically connect the ROSA 10 and the TOSA 20 to a plurality of conductive pads located on the PCB 50. The electronic components 40 are also attached to the PCB 50. An edge connector 60 is located proximate a terminal end 50A of the PCB 50 to enable the transceiver 100 to electrically interface with the host. As such, the PCB 50 facilitates electrical communication between the ROSA 10/TOSA 20 and the host.

In addition, the above-mentioned components of the transceiver 100 are partially housed within a shell 70. A cover 80 (FIG. 5) can cooperate with the housing 70 to define an outer covering of the transceiver 100. The transceiver 100 as shown in FIG. 1 is inverted such that the surfaces shown facing up in the figure are typically described as being the bottom of the transceiver. As such, a bottom surface 60A of the edge connector 60 is shown facing up in FIG. 1, while a top surface 60B of the edge connector is not visible in this view and is facing down. The references to "top," "bottom," etc., are given merely for purposes of ease and clarity in describing embodiments of the present invention and not meant to restrict the present invention in any way.

Note that, while the optical transceiver 100 in which embodiments of the present invention can be practiced will be described in some detail, it is described by way of illustration only, and not by way of restricting the scope of the invention. Indeed, other electrical data signal-carrying devices and components can similarly benefit from embodiments of the present invention, especially devices and modules having hot swappable or hot pluggable functionality.

As mentioned above, the optical transceiver 100 described and illustrated herein conforms to the small form pluggable ("SFP") form factor and operating standards as dictated by the corresponding multi-source agreement ("MSA") known in the industry. This notwithstanding, the embodiments of the present invention can be practiced with transceivers configured for optical signal transmission and reception at a variety of per-second data rates, including but not limited to 1 Gbit, 2 Gbit, 4 Gbit, 8 Gbit, 10 Gbit, or higher bandwidth fiber optic links. Furthermore, principles of the present invention can be implemented in optical transceivers or other communications modules of any form factor such as XFP and SFF, without restriction.

By way of brief overview, the transceiver 100 during operation can receive a data-containing electrical signal from an external host, which host can be any computing or communication system or device capable of communicating with the optical transceiver 100 for transmission of a data-carrying optical signal to an optical fiber (not shown). The electrical data signal supplied to the transceiver 100 from the host is carried in the transceiver 100 via a pair of differential transmit signal lines (not shown). Each signal line of the differential transmit signal line pair carries one of two streams of the data signal that differ from each other only in signal polarity. As such, the lines are respectively referred to with a "+" or a "−" indicator, indicating the respective positive or negative polarity of each line. This opposing polarity of the differential electrical data signal streams facilitates more accurate deciphering of the data contained therein by expanding the differential magnitude between a logical "1" bit and a logical "0" bit. As such, the differential electrical data signal represents a single stream of digital data that travels in the same propagation direction.

The electrical differential transmit data signal is provided to a light source, such as a laser located in the TOSA 20, which converts the electrical signal into a data-carrying optical signal for emission on to an optical fiber, connected to the transceiver via one of the ports 72 (FIG. 5), and transmission via an optical communications network, for instance. The laser can be an edge-emitting laser diode, a vertical cavity surface emitting laser ("VCSEL"), a distributed feedback ("DFB") laser, or other suitable light source. Accordingly, the TOSA 20 serves as an electro-optic transducer.

Figure 5:
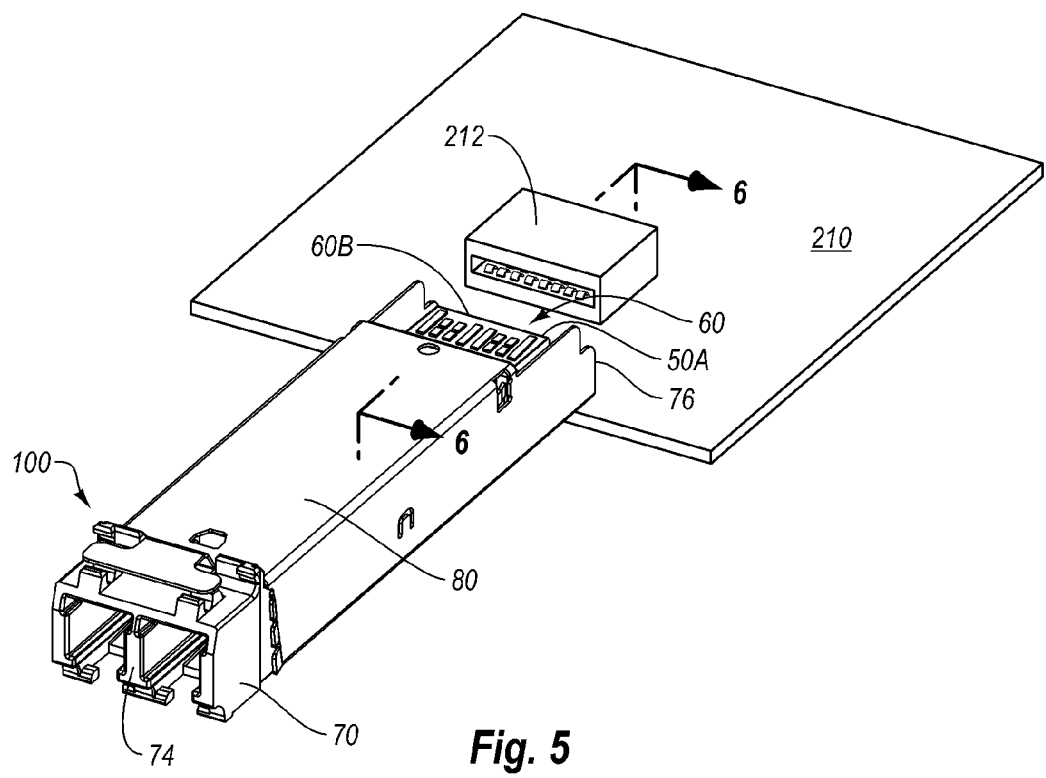
FIG. 5 is a simplified perspective view of a transceiver/host system illustrating various details thereof.

In addition, the transceiver 100 is configured to receive a data-carrying optical signal from an optical fiber operably connected to the ROSA 10 via a corresponding one of the ports 72 (FIG. 5). The ROSA 10 acts as an opto-electric transducer by transforming the received optical signal, via a photodetector or other suitable device, into an electrical data signal. The resulting electrical data signal is carried via a pair of differential receive signal lines. As is the case with the differential transmit signal lines, each signal line of the differential receive signal lines carries one of two streams of the differential electrical data signal that differ from each other only in signal polarity. As such, the lines are respectively referred to with a "+" or a "–," indicating the respective positive or negative polarity of each line.

2. Aspects of the Edge Connector

Figure 2:
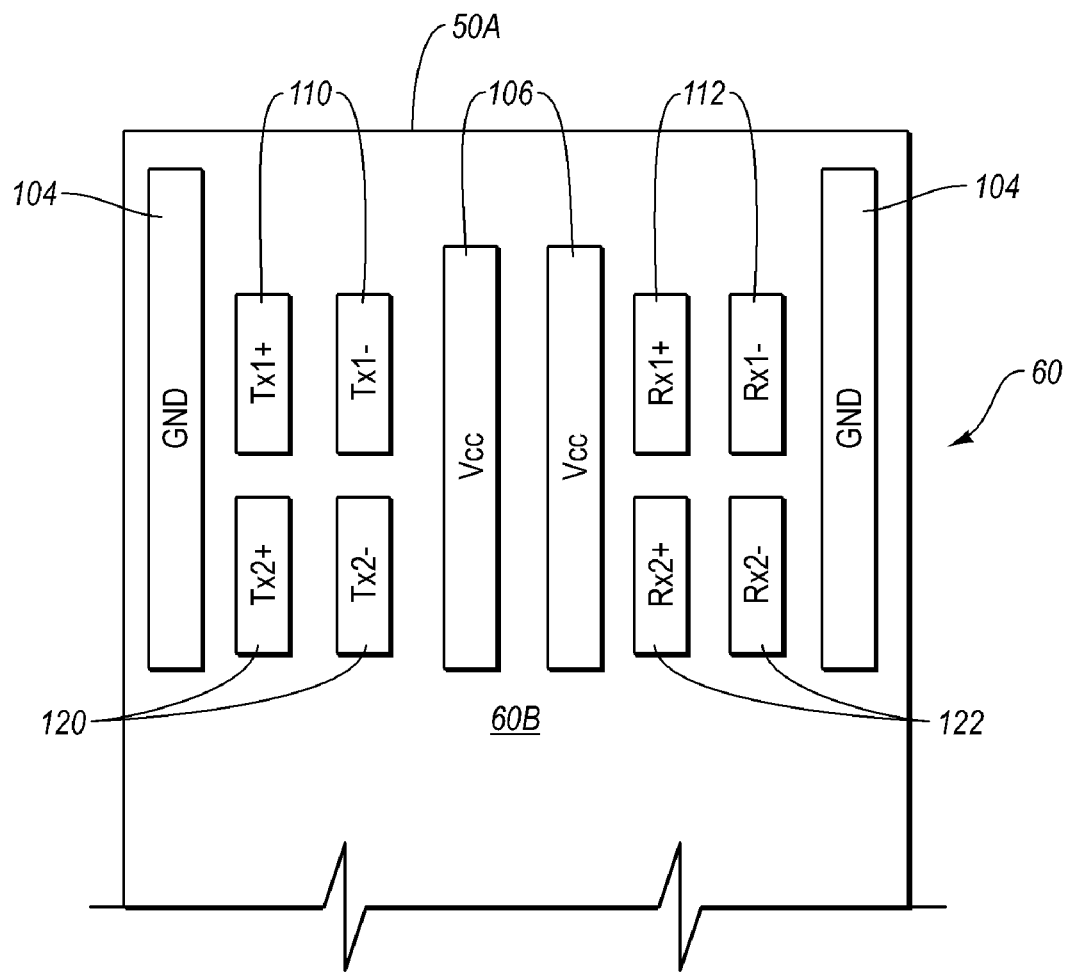
FIG. 2 is a simplified bottom view of an edge connector included with the optical transceiver module of FIG. 1, including a plurality of data signal contact pads configured in accordance with one embodiment.

Together with FIG. 1, reference is now made to FIG. 2, which shows the edge connector 60 of the PCB 50, included in the transceiver 100 of FIG. 1, according to one embodiment. The edge connector 60 is generally configured as a male-type connector to interface with a correspondingly sized female-type connector of the host, thereby operably connecting the transceiver 100 to the host. The host connector includes corresponding conductive features that are configured to electrically connect with conductive features of the edge connector 60.

Specifically, the edge connector 60 of FIG. 1 includes various conductive contact pads configured to facilitate the transfer of various signals between the host and the transceiver 100. These include two ground pads 104 for providing a ground signal and two power pads 106 for providing a power supply to components of the transceiver 100. Both the ground signal and the power supply signal are provided to the transceiver 100 by the host via the host connector when the edge connector of the transceiver is operably received by the host connector. Conductive traces (not shown) are disposed on the PCB 50 to carry these signals to the respective components contained on the PCB.

Note that the contact pads shown in FIG. 2 are included on the top surface 60B of the edge connector 60. Other contact pads are included on the bottom surface 60A, as shown in FIG. 1, that enable additional functionality for the transceiver 100, including digital diagnostic monitoring and reporting of transceiver operations. However, the present invention should not be so limited, and it is appreciated that the contact pad configurations shown here can be altered from what is explicitly shown while still adhering to the spirit of the present invention. Indeed, in one embodiment the contact pad configurations can be included on one or both surfaces of the edge connector. In yet another embodiment, the contact pad or other conductive features are included on a connective portion of the transceiver or communications module that is not a part of the PCB. These and other modifications are therefore contemplated as part of the present invention.

In accordance with one embodiment of the present invention, a plurality of data signal contact pads are included on the top surface 60B of the edge connector 60 shown in FIG. 2. These data signal contact pads are grouped in pairs and are positioned at the terminations of conductive traces disposed on or in the PCB 50, referred to above as differential data signal lines (not shown). As explained, these differential data signal lines carry dual streams of data between the TOSA 10 or ROSA 20 and the host. As was the case with the ground pads 104 and power pads 106, the data signal contact pads of the edge connector surface 60B are configured and positioned so as to electrically connect with corresponding conductive features included in the connector of the host or other device with which the transceiver 100 is operably connected.

In contrast to known edge connector data signal pad configurations, which include only a single pair of contact pads for the differential transmit data signal and a single pair for the differential receive data signal, embodiments of the present invention provide for multiple transmit and receive data signal contact pad pairs to be disposed on the edge connector surface in a predetermined manner, thereby enabling multiple sets of optical signals to be transmitted and/or received by a single transceiver. In particular, FIG. 2 shows one embodiment of this principle, wherein a first pair of transmit data signal contact pads, referred to herein as first Tx pads, are shown at 110, and a first pair of receive data signal contact pads, referred to herein as first Rx pads, are shown at 112. The first Tx pads 110 are indicated in FIG. 2 with a "Tx1+" and "Tx1–" and the first Rx pads 112 are indicated with an "Rx1+" and "Rx1–" to designate the contact pads and their respective connection with a respective one of the differential data signal lines of the PCB 50 having either a positive or negative polarity, as is known in the art.

The first Tx and Rx pads 110 and 112 have a function similar to the Tx+/– and Rx+/– data signal contact pads typically included on known edge connectors. In contrast to known edge connectors, however, the edge connector and contact pad configuration as shown in FIG. 2 has been modified in accordance with the present embodiment so as to accommodate additional data signal contact pad pairs on the connector surface, thereby increasing the number of signal paths between the host and the transceiver, which in turn increases signal path density without increasing required space.

In further detail, the increased signal path density described above is implemented in the embodiment shown in FIG. 2 by a pair of second Tx pads 120 and a pair of second Rx pads 122. As is the case with the first Tx and Rx pads 110 and 112, the second Tx2+/– and Rx2+/– pads 120 and 122 serve as terminations for respective differential transmit and receive data signal lines (not shown) disposed on or in the PCB 50. Also, the connector of the host device with which the transceiver 100 is operably connected is configured to electrically connect to the these additional contact pads so as to enable the host to benefit from the additional data transfer possible via the signal paths represented by the second Tx and Rx pads 120 and 122.

Placement of the second Tx and Rx pads 120 and 122 on the edge connector top surface 60B is made possible by configuring the first Tx and Rx pads 110 and 112 in a predetermined manner, namely, by reducing their pad length compared to known designs. This in turn facilitates placement of the second Tx and Rx pads 120 and 122 linearly behind the first Tx and Rx pads 110 and 112, as viewed from the terminal end 50A of the PCB 50 in a manner so as to double data signal capacity. Particularly, the second Tx pads 120 are each disposed linearly behind the first Tx pads 110, and the second Rx pads 122 are each disposed linearly behind the first Rx pads 112. Thus, the design of the present embodiment represents an increase in space utilization efficiency over previous known edge connector designs.

In one embodiment, the first and second pads 110/112 and 120/122 are rectangular in shape and each has a length and width of approximately 1.3 mm and 0.55 mm, respectively, with the length falling within a range of approximately 1.2 and 1.4 mm. A gap of approximately 0.25 mm exists between the row of the first pads 110/112 and the row of second pads 120/122. Of course, other contact pad dimensions, shapes, and spacings are also possible.

Note that the order and particular placement of the various data signal contact pads on the edge connector surface can be modified from what is explicitly described herein. For instance the placement of the first and second Tx or Rx pads can be reversed either front-to-back or side-to-side. Also, as mentioned the data signal contact pads can also be placed on the bottom surface 60A of the edge connector 60, if desired.

Figure 3:
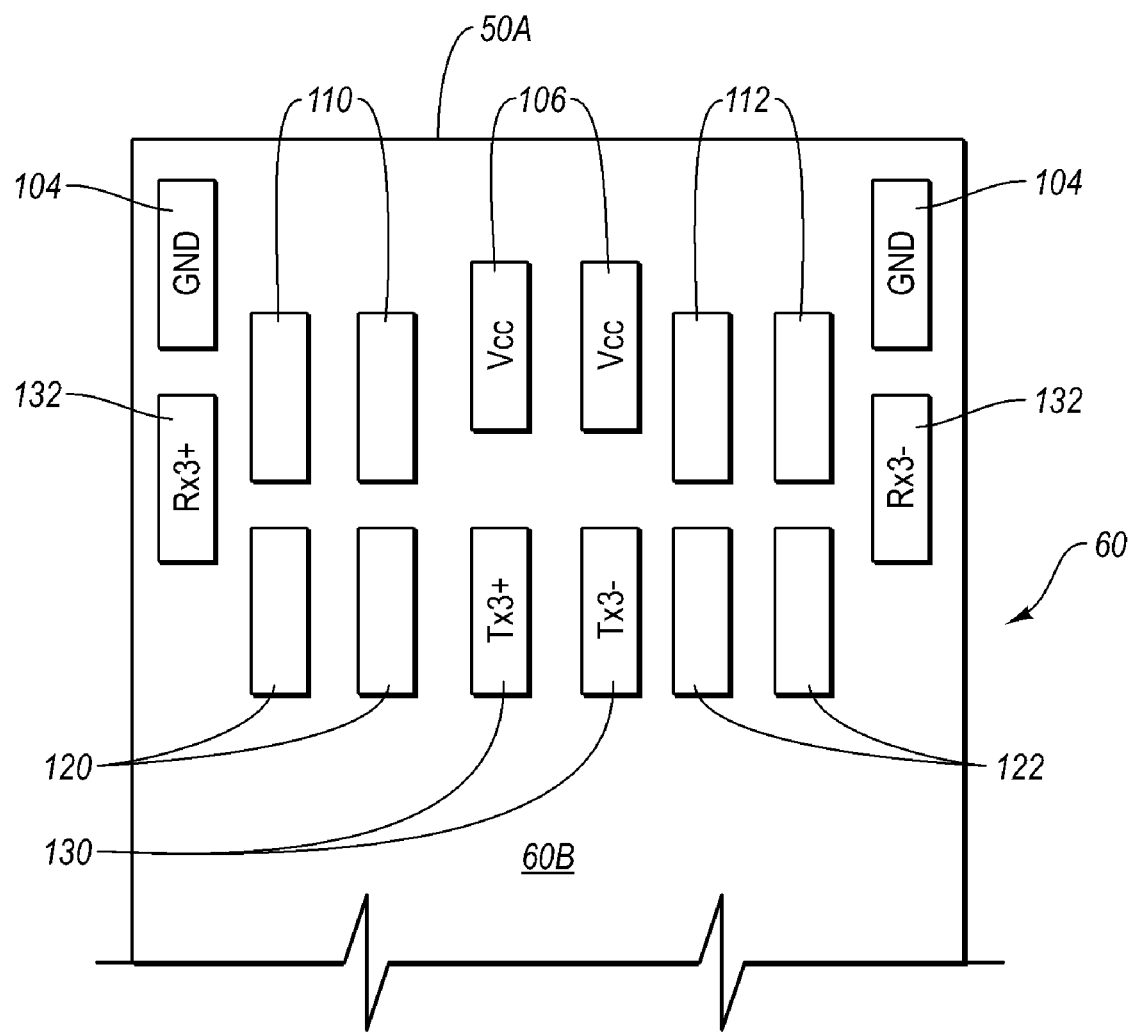
FIG. 3 is a simplified bottom view of an edge connector configured in accordance with another embodiment.

Reference is now made to FIG. 3, which depicts various features of another exemplary embodiment of the present invention. As noted above, the edge connector design can be modified in different ways in order to increase data signal pad density. FIG. 3 gives one example of this, wherein the number of data signal contact pad pairs disposed on the edge connector surface is tripled over typical designs. In particular, FIG. 3 shows the top surface 60B of the edge connector 60 including ground pads 104 and power pads 106, as before. In contrast to the embodiment depicted in FIG. 2, both the ground pads 104 and power pads 106 are shortened in length so as to accommodate additional data signal pads.

In addition to the first Tx and Rx pads 110, 112 and second Tx and Rx pads 120, 122, the edge connector top surface 60B of FIG. 3 includes a pair of third Tx pads 130 and a pair of third Rx pads 132. As configured in the present embodiment, the third Tx3+/− pads 130 are arranged linearly behind the shortened power pads 106, while one each of the third Rx3+/− pads 132 is positioned linearly behind each of the ground pads 104. Of course, other positional arrangements for the third Tx and Rx pads are also possible.

As mentioned, the edge connector embodiment depicted in FIG. 3 triples the number of differential data signal transmit and receive path sets (three sets) over that of known designs (one set) such that data path density is desirably increased for the host device. This embodiment therefore illustrates one example of embodiments of the present invention for increasing signal path density for a communications module, and other configurations in harmony with the principles described herein are also contemplated as falling within the claims of the present invention.

Figure 4:
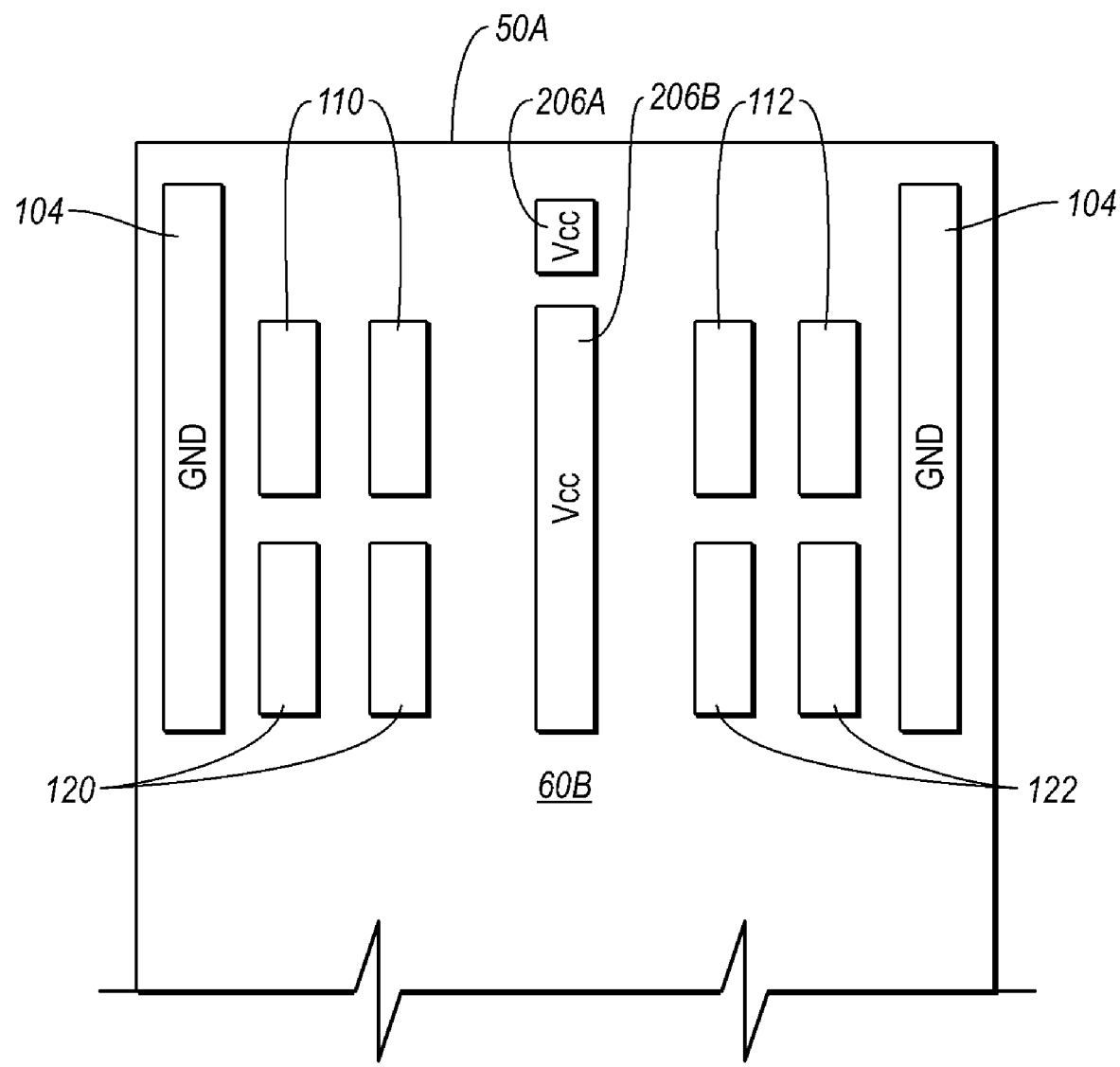
FIG. 4 is a simplified bottom view of an edge connector configured in accordance with yet another embodiment.

Reference is now made to FIG. 4, which depicts the top surface 60B of the edge connector 60 according to yet another exemplary embodiment of the present invention. In particular, FIG. 4 shows the edge connector top surface 60B including the ground pads 104 configured according to the embodiment shown in FIG. 2. First and second Tx and Rx pads 110, 112 and 120, 122 are also shown disposed as in FIG. 2. Power pads are also included on the edge connector top surface 60B, but are linearly positioned with respect to one another as opposed to the parallel positioning shown in FIG. 2. In detail, a first power pad 206A is disposed nearest the terminal end 50A of the PCB 50, while a second power pad 206B is disposed linearly behind the first power pad. A spacing exists between the first and second power pads of approximately 0.25 mm, in one embodiment. Arrangement of the power pads in this manner is useful if it is desired to generate a power pulse signal in connection with a power cycling process as the edge connector 60 is inserted into the corresponding connector of the host device. Of course, any number of different contact pad configurations can be employed on the edge connector surface, according to the needs of the particular application, including modification of the respective lengths of the first and second power pads.

Figure 6:
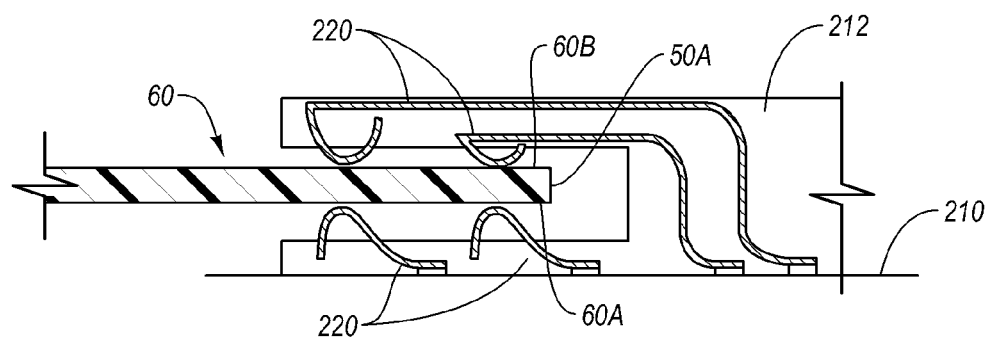
FIG. 6 is a simplified cross sectional view, taken along the lines 6-6, showing engagement of an edge connector of the transceiver of FIG. 5 with a connector of the host.

Reference is now made to FIGS. 5 and 6, which depict various details regarding the operable connection of a host device with a communications module, such as the transceiver 100 shown in FIG. 1, including an edge connector configured in accordance with one embodiment of the present invention. In particular, FIGS. 5 and 6 show a host board 210 included as a component of a host device or system. The host board 210 includes a female host connector 212 that receives the edge connector 60 of the transceiver 100. The transceiver 100 is shown having a full enclosure including the shell 70 and the cover 80 that cooperatively fits with the shell.

FIG. 5 shows that the edge connector 60 includes a contact pad configuration similar to that of FIG. 2, wherein two sets Tx/Rx contact pad pairs are included on the top edge connector surface 60B. The female host connector 212 includes corresponding conductive features that electrically couple with the edge connector contact pads upon receipt of the edge connector 60 therein. FIG. 6 shows this arrangement in cross section, wherein the edge connector 60 of the transceiver 100 is shown received within the host connector 212. So received, the conductive contact pads disposed on both the bottom surface 60A and top surface 60B are positioned so as to electrically connect with conductive contact pins 220 that extend into the interior portion of the host connector when the edge connector is slid therein.

The contact pins 220 of the host connector 212 are configured such that the various signals carried to and from the contact pads of the edge connector surface 60A—such as the grounds pads 104, power pads 106, first Tx and Rx pads 110, 112 and second Tx and Rx pads 120, 122 shown in FIG. 2—can pass between the contact pads and the conductive contact pins, thereby allowing communication between the host and the transceiver 100. Also, each of the contact pins 220 is operably connected to the host board 210, thereby completing the electrical signal path between the edge connector 60 and the host board 210 and operably connecting the transceiver to the host device.

Note that the contact pins 220 and their particular configuration shown in FIG. 6 are exemplary only, and various other conductive feature configurations can be included in the host board connector to establish electrical communication with the edge connector 60. Preferably, at least one contact pin 220 is included in the host connector 212 for connection with a respective contact pad disposed on the surfaces 60A, 60B of the edge connector 60.

Figures 7, 8:
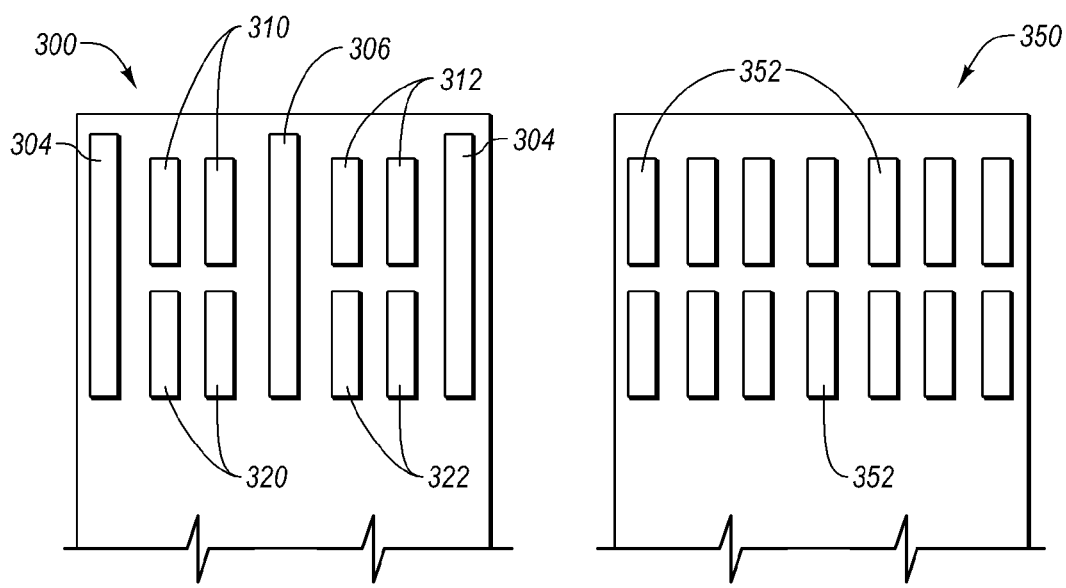
FIG. 7 is a simplified bottom view of an edge connector configured in accordance with still another embodiment.
FIG. 8 is a simplified bottom view of an edge connector configured in accordance with one alternative embodiment.

FIGS. 7 and 8 depict additional possible embodiments for data signal contact pad configurations that increase data signal path density for a communication module. Briefly, FIG. 7 shows a contact pad configuration 300 including ground pads 304, a power pad 306, first Tx/Rx pads 310, 312, and second Tx/Rx pads 320, 322. As shown, the configuration of FIG. 7 includes only one power pad, in contrast to previous embodiments. FIG. 8 shows another possible contact pad configuration 350 including various contact pads 352 that can be configured to support three Tx/Rx data signal contact pad sets. These Figures therefore depict further examples of possible data signal contact pad configurations for a communication module. It is possible in one embodiment, for example, to further sub-divide the contact pads shown in FIG. 8 so as to increase the number of data signal contact pad sets.

Figure 9:
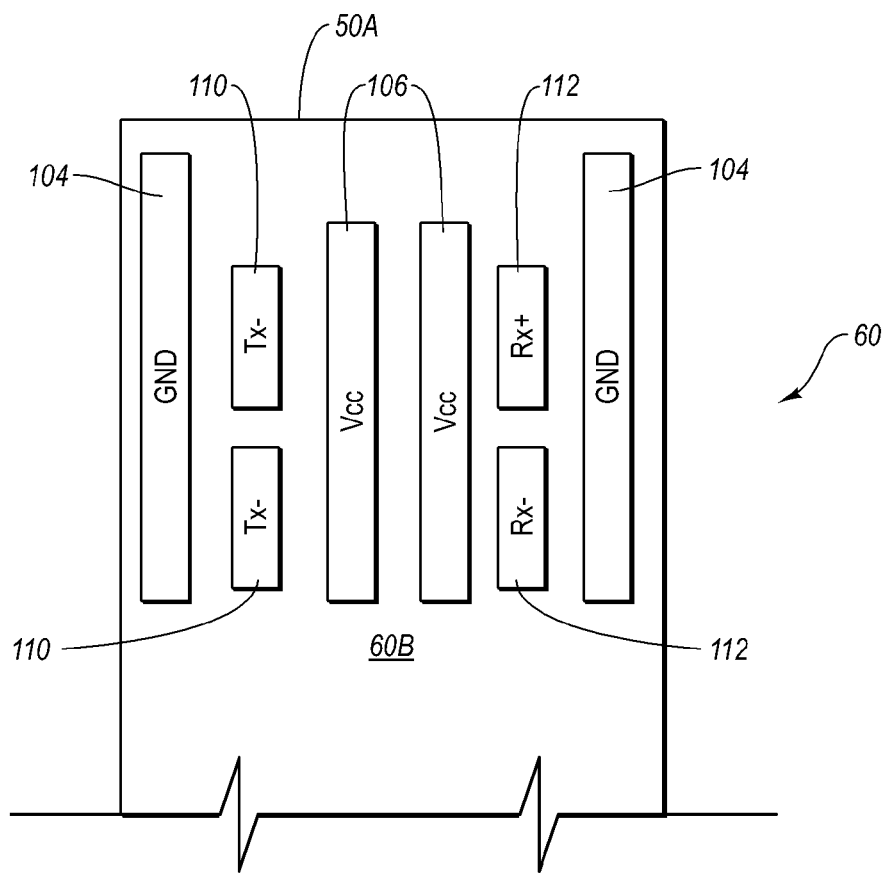
FIG. 9 is a simplified bottom view of an edge connector configured in accordance with yet another embodiment.

FIG. 9 depicts yet another embodiment, wherein the connector 60 is reduced in width while maintaining a typical number of data signal contact pads. In detail, the ground pads 104 and power pads 106 are shown, together with a first pair of differential transmit data signal contact pads 110, placed linearly with respect to one another along a common longitudinal axis, and a first pair of differential receive data signal contact pads 112, also placed linearly with respect to one another along a common axis. Arrangement of the data signal contact pads in this manner does not increase the signal path density of the edge connector 60, but does allow its width to be reduced, if desired. Such a configuration may be desired where overall transceiver dimensions are to be reduced, for example. As well, the length of the edge connector could be reduced via a similar configuration, if desired.

Moreover, it should be appreciated that the embodiments described above can be applied to optical transceiver modules of various types, including various hot pluggable designs, as well as with other non-communication based devices that are hot pluggable in design. Note also that principles of the above embodiments can be applied to connector contact pads not traditionally associated with data signal transfer, but that would nevertheless benefit from an increase in pad density.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transceiver module, comprising:
   a shell partially containing a printed circuit board; and
   an edge connector included on the printed circuit board, the edge connector including:
      a plurality of conductive contact pads including:
         a first ground contact pad;
         a first power supply contact pad;
         a first plurality of differential transmit data signal contact pads;
         a second plurality of differential transmit data signal contact pads, the second plurality being linearly aligned with the first plurality of differential transmit data signal contact pads such that the second plurality of differential transmit data signal contact pads is disposed behind the first plurality of differential transmit data signal contact pads as viewed from a host connector corresponding to the edge connector;
         a first plurality of differential receive data signal contact pads; and
         a second plurality of differential receive data signal contact pads, the second plurality being linearly aligned with the first plurality of differential receive data signal contact pads such that the second plurality of differential receive data signal contact pads is disposed behind the first plurality of differential receive data signal contact pads as viewed from the corresponding host connector.

2. The optical transceiver module as defined in claim 1, wherein the plurality of conductive contact pads further includes:
   a second ground contact pad;
   a second power supply contact pad;
   an additional set of differential transmit and receive signal contact pads, including:
      a third plurality of differential transmit data signal contact pads, the third plurality being linearly aligned with the first and second power supply contact pads; and
      a third plurality of differential receive data signal contact pads, the third plurality being linearly aligned with the first and second ground contact pads.

3. The optical transceiver module as defined in claim 2, wherein the first and second power supply contact pads are linearly aligned with one another so as to provide power cycling when the optical transceiver module is inserted into the corresponding host connector.

4. The optical transceiver module as defined in claim 1, wherein the data signal contact pads are rectangular in shape, each having a length between about 1.2 and 1.4 mm and a width of about 0.55 mm.

5. The optical transceiver module as defined in claim 1, wherein the optical transceiver module is hot swappable.

6. The optical transceiver module as defined in claim 1, wherein the plurality of conductive contact pads are included on a first planar surface of the edge connector and wherein additional conductive contact pads are included on a second planar surface of the edge connector.

7. The optical transceiver module as defined in claim 1, wherein the plurality of conductor pads further includes:
   a second ground contact pad; and
   a second power supply contact pad,
   wherein the first and second ground contact pads are disposed adjacent opposite side portions of the edge connector and the first and second power supply contact pads are disposed proximate a central portion of the edge connector, and
   wherein the first and second pluralities of differential transmit data signal contact pads are disposed between the first ground contact pad and the first power supply contact pad and the first and second pluralities of differential receive data signal contact pads are disposed between the second ground contact pad and the second power supply contact pad.

8. The optical transceiver module as defined in claim 1, wherein the optical transceiver module further includes a transmit optical subassembly and a receiver optical subassembly that are each operably connected with the printed circuit board.

9. The optical transceiver module as defined in claim 1, wherein the plurality of conductive contact pads are arranged to operably connect with a plurality of conductive pins in the corresponding host connector when the edge connector is connected with the corresponding host connector.

10. The optical transceiver module as defined in claim 1, wherein a length of the first ground contact pad is greater than a combined length of any one of the pairs of differential data signal contact pads.

11. An optical transceiver module, comprising:
   a shell partially containing a printed circuit board; and
   an edge connector included on the printed circuit board, the edge connector including:
      a plurality of conductive contact pads including:
         a plurality of ground contact pads;
         a plurality of power supply contact pads; and
         a pair of differential data signal contact pads linearly aligned with one another along a longitudinal axis such that each of the contact pads in the pair of differential data signal contact pads is offset by an equal distance from at least one of the contact pads in the group comprising the ground and power supply contact pads wherein the pair of differential data signal contact pads are transmit data signal contact pads, and the edge connector further comprises a pair of differential receive data signal contact pads linearly aligned with one another along the longitudinal axis; and
      wherein the pair of differential transmit data signal contact pads are disposed between a first one of the ground contact pads and a first one of the power supply contact pads and the pair of differential receive data signal contact pads are disposed between a second one of the ground contact pads and a second one of the power supply contact pads.

12. The optical transceiver module as defined in claim 11, wherein the plurality of conductive contact pads are included on a first planar surface of the edge connector and wherein additional conductive contact pads are included on a second planar surface of the edge connector.

13. The optical transceiver module as defined in claim 11, wherein the optical transceiver module further includes a transmit optical subassembly and a receiver optical subassembly that are each operably connected with the printed circuit board.

14. The optical transceiver module as defined in claim 11, wherein the plurality of conductive contact pads are arranged to operably connect with a plurality of conductive pins in a mating connector of a host device when the edge connector is connected with the mating host device connector.

15. The optical transceiver module as defined in claim 11, wherein a length of any one of the ground contact pads is greater than a combined length of the pair of differential data signal contact pads.

16. The optical transceiver module as defined in claim 11, wherein the plurality of conductive contact pads are arranged in no more than six separate columns disposed along a dimension of the printed circuit board substantially perpendicular to the longitudinal axis along which the pair of data signal contact pads are linearly aligned.

* * * * *